(12) United States Patent
Johnson et al.

(10) Patent No.: US 8,361,847 B2
(45) Date of Patent: Jan. 29, 2013

(54) STRESSED CHANNEL FET WITH SOURCE/DRAIN BUFFERS

(75) Inventors: Jeffrey B. Johnson, Essex Junction, VT (US); Ramachandran Muralidhar, Mahopac, NY (US); Philip J. Oldiges, Lagrangeville, NY (US); Viorel C. Ontalus, Danbury, CT (US); Kai Xiu, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/009,029

(22) Filed: Jan. 19, 2011

(65) Prior Publication Data
US 2012/0181549 A1 Jul. 19, 2012

(51) Int. Cl.
*H01L 21/336* (2006.01)
(52) U.S. Cl. .................... 438/151; 257/E21.41
(58) Field of Classification Search ............ 438/151; 257/E21.41
See application file for complete search history.

(56) References Cited

U.S. PATENT DOCUMENTS

| | | | |
|---|---|---|---|
| 6,921,913 B2 | 7/2005 | Yeo et al. | |
| 7,135,372 B2 | 11/2006 | Huang et al. | |
| 7,303,949 B2 | 12/2007 | Chen et al. | |
| 7,399,663 B2 | 7/2008 | Hoentschel et al. | |
| 7,554,110 B2 | 6/2009 | Yu et al. | |
| 7,592,231 B2 * | 9/2009 | Cheng et al. | 438/300 |
| 7,605,407 B2 | 10/2009 | Wang | |
| 7,759,199 B2 | 7/2010 | Thomas et al. | |
| 7,767,503 B2 | 8/2010 | Zhu et al. | |
| 8,062,948 B2 * | 11/2011 | Shin | 438/300 |
| 2007/0096201 A1 | 5/2007 | Ning | |
| 2008/0006818 A1 | 1/2008 | Luo et al. | |
| 2008/0119031 A1 * | 5/2008 | Pal et al. | 438/483 |
| 2008/0220579 A1 * | 9/2008 | Pal et al. | 438/265 |

* cited by examiner

*Primary Examiner* — Alexander Ghyka
*Assistant Examiner* — Stanetta Isaac
(74) *Attorney, Agent, or Firm* — Cantor Colburn LLP; David Cain

(57) ABSTRACT

A method for forming a stressed channel field effect transistor (FET) with source/drain buffers includes etching cavities in a substrate on either side of a gate stack located on the substrate; depositing source/drain buffer material in the cavities; etching the source/drain buffer material to form vertical source/drain buffers adjacent to a channel region of the FET; and depositing source/drain stressor material in the cavities adjacent to and over the vertical source/drain buffers.

15 Claims, 7 Drawing Sheets

STRESSED CHANNEL FET WITH SOURCE/DRAIN BUFFERS

BACKGROUND

This disclosure relates generally to the field of semiconductor manufacturing, and more particularly to forming a field effect transistor (FET) device with a stressed channel region.

Mechanical stresses within a semiconductor device substrate may be used to modulate device performance. For example, in silicon (Si) technology, the channel of a FET may be oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in a direction normal of the channel. Therefore, compressive and/or tensile stresses can be advantageously created in the channel regions of a p-type FET (PFET) or an n-type FET (NFET) in order to enhance the performance of such devices.

One possible approach for creating a desirable stressed channel region is to form embedded silicon germanium (SiGe) for PFET or silicon carbide (SiC) for NFET source/drain stressor material in stress cavities in the source/drain regions of a FET device to induce compressive or tensile strain in the channel region which is located between the source and drain regions. The source/drain stressor material may be heavily doped in situ to avoid implant damage to the stressor that can degrade the channel stress. While the channel stress increases as the stressor proximity to the channel decreases, close proximity of the highly doped source/drain stressor material to the FET channel may degrade the electrostatics of the finished stressed channel FET device. Particularly, heavily doped source/drain material in close proximity to the channel region may exacerbate short channel effect and punchthrough issues, and may also increase parasitic leakage, junction capacitance, and floating body effects from band to band tunneling during FET operation.

SUMMARY

In one aspect, a method for forming a stressed channel field effect transistor (FET) with source/drain buffers includes etching cavities in a substrate on either side of a gate stack located on the substrate; depositing source/drain buffer material in the cavities; etching the source/drain buffer material to form vertical source/drain buffers adjacent to a channel region of the FET; and depositing source/drain stressor material in the cavities adjacent to and over the vertical source/drain buffers.

In one aspect, a stressed channel field effect transistor (FET) includes a substrate; a gate stack located on the substrate; a channel region located in the substrate under the gate stack; source/drain stressor material located in cavities in the substrate on either side of the channel region; and vertical source/drain buffers located in the cavities in the substrate between the source/drain stressor material and the substrate, wherein the source/drain stressor material abuts the channel region above the source/drain buffers.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE DRAWINGS

Referring now to the drawings wherein like elements are numbered alike in the several FIGURES.

DETAILED DESCRIPTION

Embodiments of a stressed channel FET device including source/drain buffers, and a method of making a stressed channel FET device including source/drain buffers are provided, with exemplary embodiments being discussed below in detail. Formation of source/drain buffers between the channel and the embedded source/drain stressor material acts to reduce junction capacitance and leakage current in the stressed channel FET during operation, while allowing relatively close proximity of the source/drain stressor material to the channel, which increases the amount of embedded stressor material in the FET device and the amount of stress induced by the stressor material in the channel. The source/drain buffers may be lightly doped or undoped SiGe or SiC in various embodiments.

Figure 1:
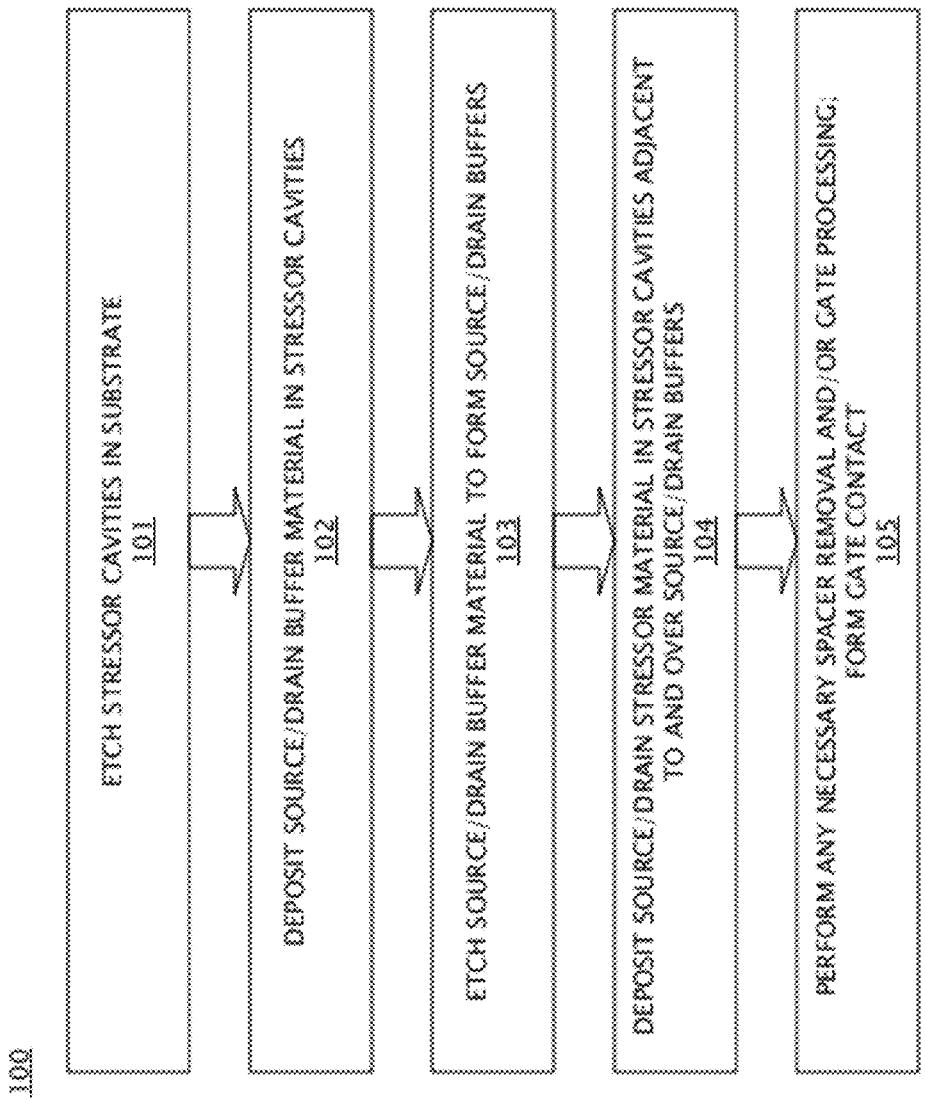
FIG. 1 illustrates a flowchart of an embodiment of a method of making an embedded stressor channel FET with source/drain buffers.
Figure 2:
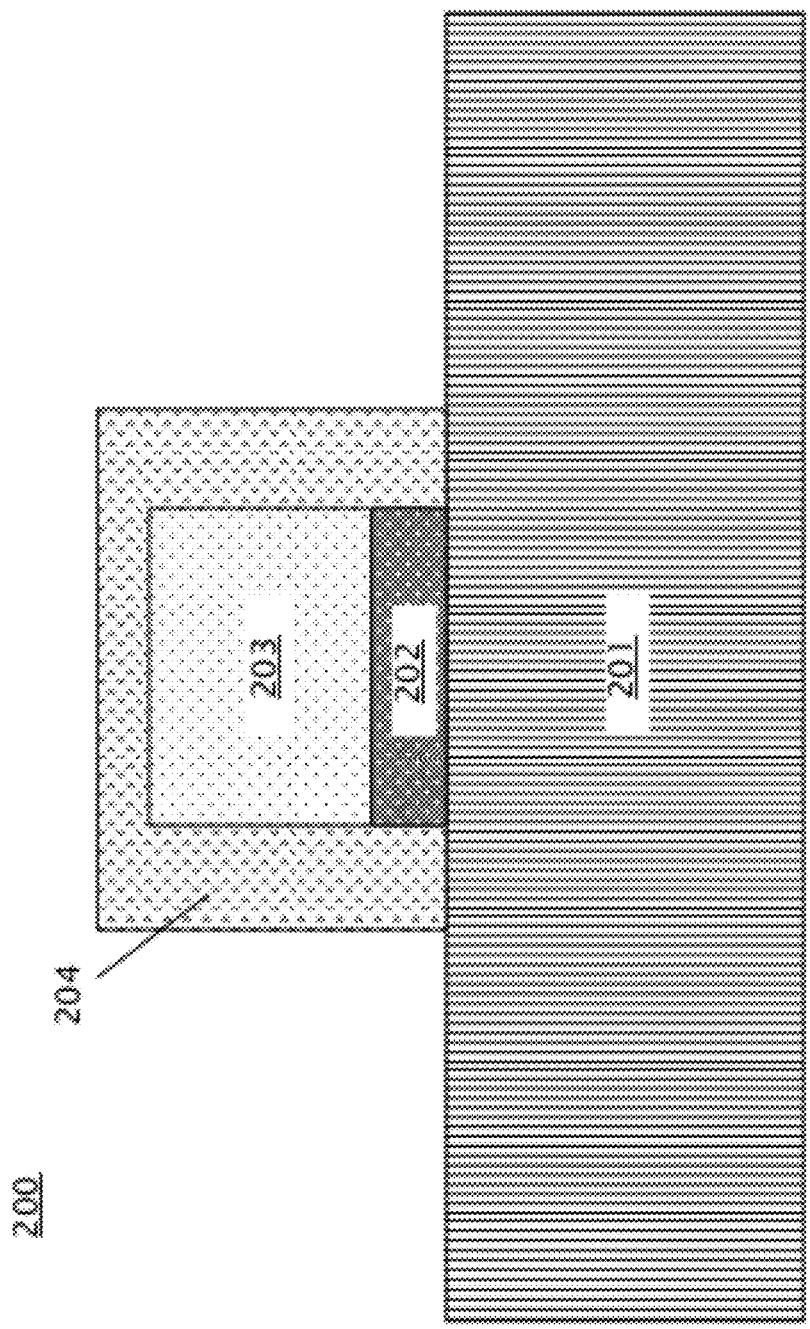
FIG. 2 is a schematic block diagram illustrating an embodiment of a substrate with a gate and spacers.
Figure 3:
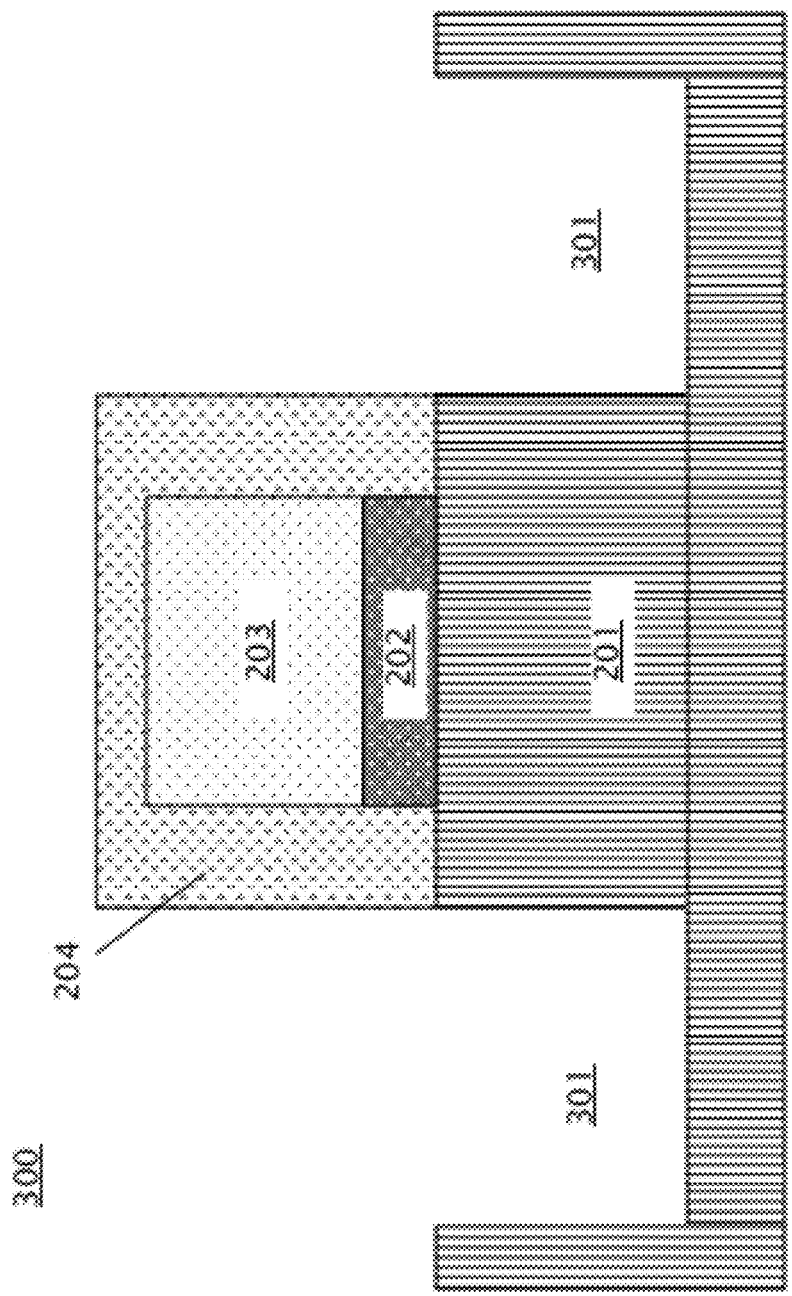
FIG. 3 is a schematic block diagram illustrating an embodiment of the device of FIG. 2 after embedded stressor cavity etching.

FIG. 1 illustrates an embodiment of a method 100 of forming a stressed channel FET with source/drain buffers. Method 100 may be used to form an NFET or a PFET in various embodiments. FIG. 1 is discussed with reference to FIGS. 2-7. In block 101, a starting device 200, as is shown in FIG. 2, is provided. Device 200 includes a gate stack structure, including a gate dielectric layer 202 and gate electrode 203, and a spacer 204 surrounding the gate stack structure, located on a substrate 201. The gate stack structure 202/203 may be any appropriate type of FET gate, including but not limited to a high-k/metal gate, polysilicon, or a dummy gate for a FET made by a replacement gate process in various embodiments. Spacer 204 may be a dielectric material such as a nitride or an oxide in some embodiments. Spacer 204 acts to protect the gate stack structure 202/203 during performance of method 100; in the embodiment shown in FIG. 1, spacer 204 covers the top of the gate stack structure 202/203. Substrate 201 may be a silicon substrate in some embodiments, or a silicon-on-insulator (SOI) substrate in other embodiments, including a top silicon layer over a buried oxide (BOX) layer. The substrate 201 of device 200 is etched in block 101 to form embedded stressor cavities 301 in substrate 201, as shown device 300 of FIG. 3. Embedded stressor cavities 301 are etched in substrate 201 on either side of the gate stack structure 202/203 and spacer 204. The etch of block 101 may include a reactive ion (RIE) etch, and may be an anisotropic etch or a combination of anisotropic and isotropic etches to set desired proximity to the gate edge of the FET in various embodiments. The depth of the embedded stressor cavities 301 in substrate 201 may be from about 30 to about 80 nanometers (nm) in some embodiments. The bottoms of embedded stressor cavities 301 may almost abut the BOX of substrate 201 in embodiments in which substrate 201 includes SOI; however, some semiconductor material is needed between the BOX and the bottoms of stressor cavities 301 to facilitate subsequent epitaxial growth. After etching of the embedded stressor cavities 301, a portion of substrate 201 located at the bottoms of the cavities 301 may be optionally doped in some embodiments. This optional doping may include doping with boron for formation of a PFET, or phosphorous for formation of an NFET.

Figure 4:
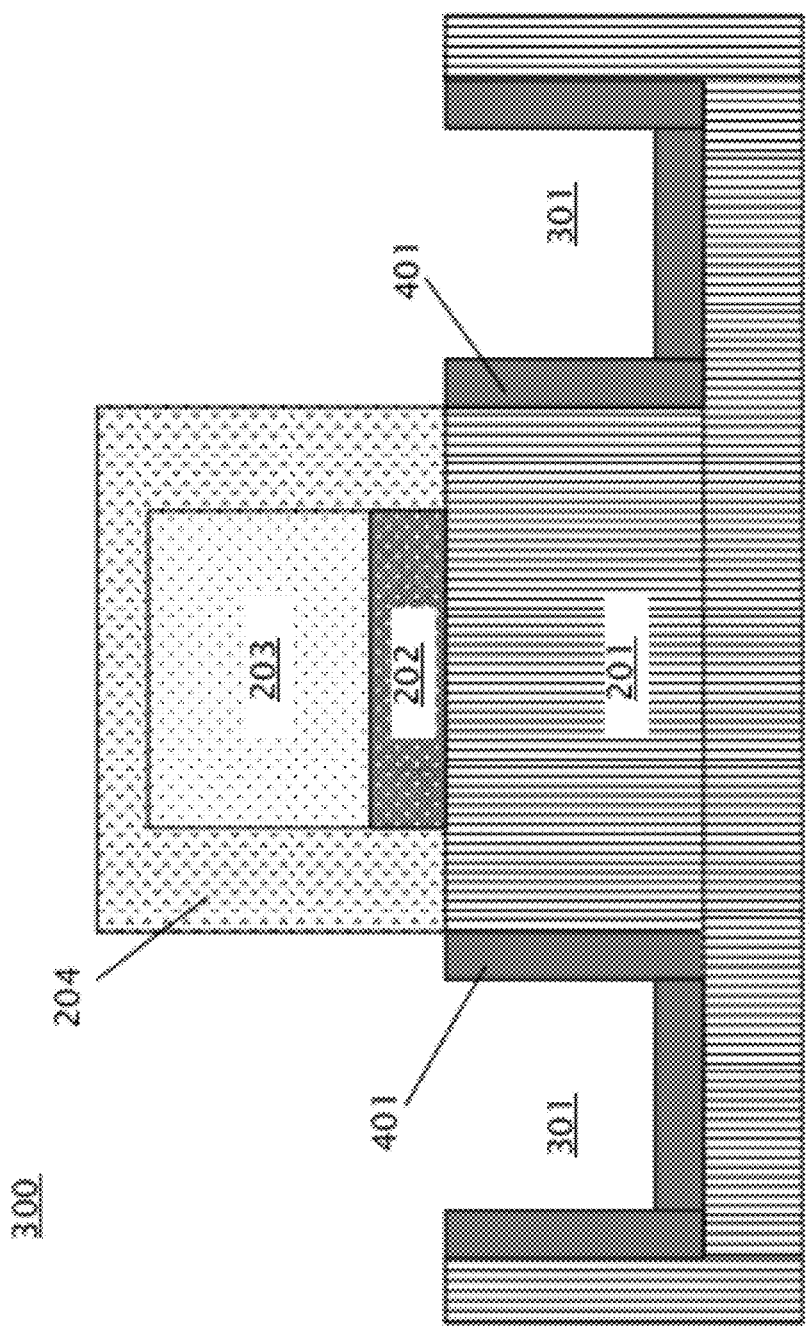
FIG. 4 is a schematic block diagram illustrating an embodiment of the device of FIG. 3 after deposition of source/drain buffer material in the embedded stressor cavities.

In block 102, source/drain buffer material 401 is deposited in the embedded stressor cavities 301, resulting in the device 400 as shown in FIG. 4. Source/drain buffer material 401 may include undoped SiGe or low-doped boron SiGe for formation of a PFET, or may include undoped SiC or low-doped phosphorous SiC for formation of a PFET. The deposition of source/drain buffer material 401 is epitaxial. Source/drain buffer material 401 may also form on spacer 204 in some embodiments. The deposited source/drain buffer material 401 may have a thickness from about 5 nanometers to about 15 nanometers in some embodiments.

Figure 5:
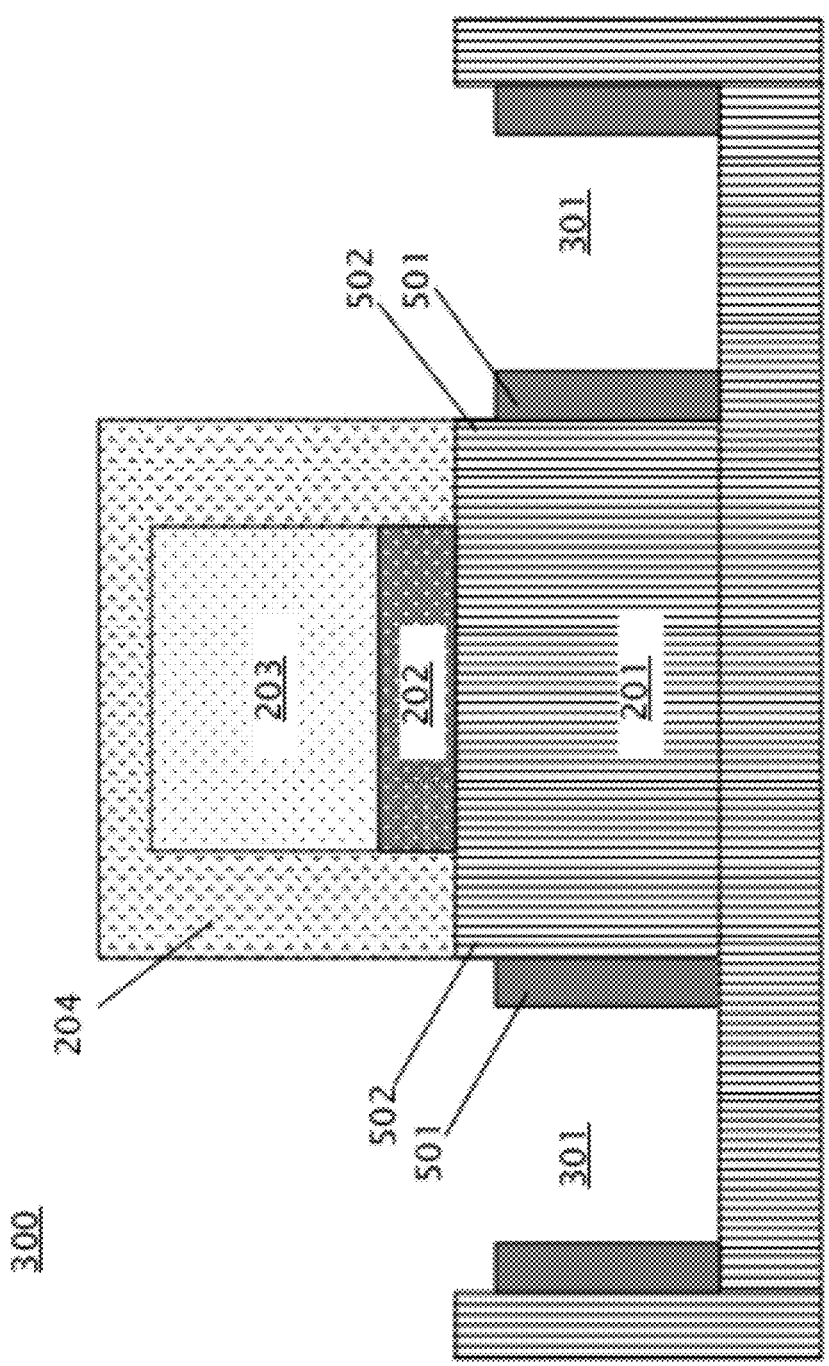
FIG. 5 is a schematic block diagram illustrating an embodiment of the device of FIG. 4 after etching the source/drain buffer material to form source/drain buffers.

In block 103, the deposited source/drain buffer material 401 is etched, resulting in vertical source/drain buffers 501 in stressor cavities 301 as shown in FIG. 5. The source/drain buffers are located adjacent to FET channel region 502 in substrate 201. The tops of source/drain buffers 501 are recessed to expose a portion of a channel region 502 of substrate 201 underneath gate 202/203 and spacer 204. The etch of block 103 may include anisotropic RIE, and may be to a depth from about 5 nm to about 15 nm below the gate stack structure 202/203 and spacer 204 in some embodiments. In the embodiment shown in FIG. 4, all of the deposited source/drain buffer material 401 is removed from the bottoms of the embedded stressor cavities 301; however, in some embodiments, some deposited source/drain buffer material may remain in the bottoms of embedded stressor cavities 301 after the RIE etch of block 103.

Figure 6:
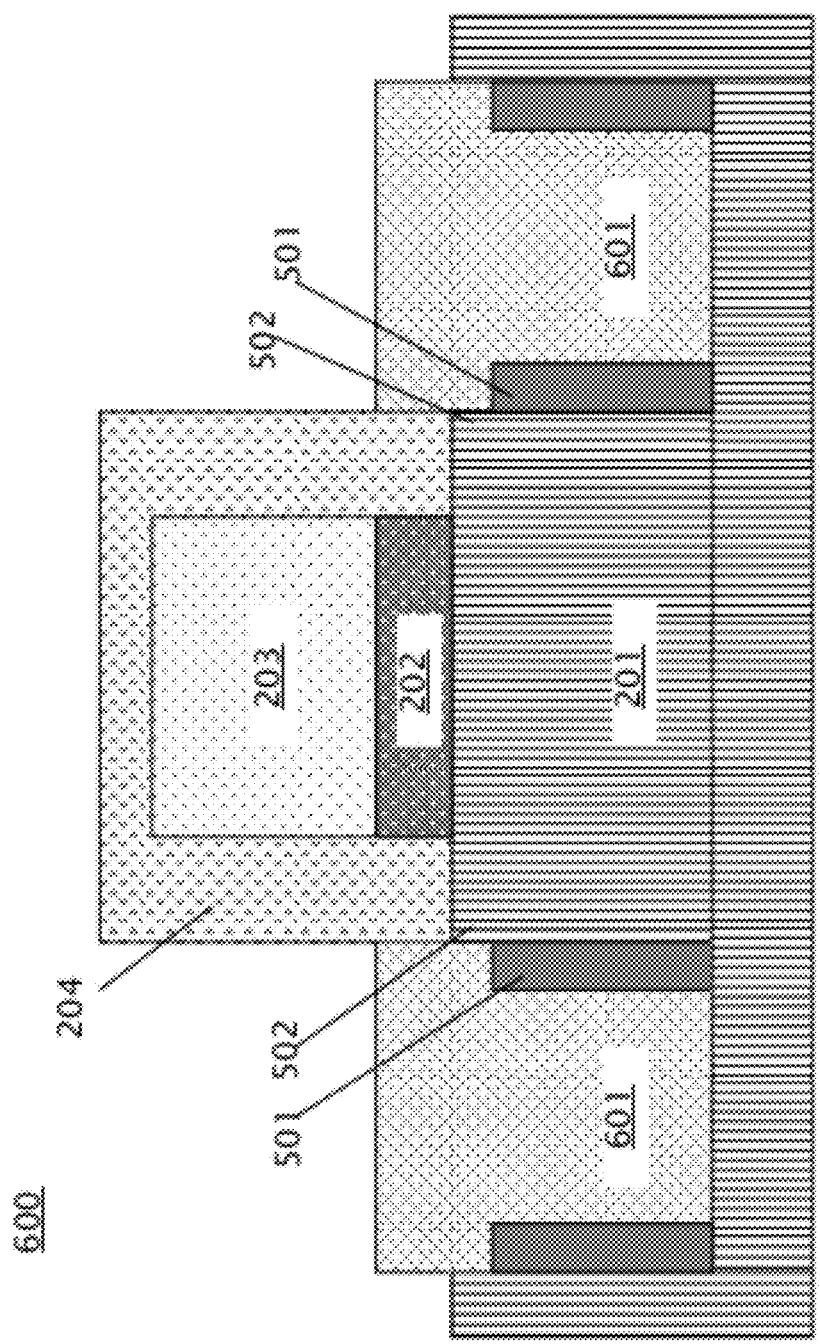
FIG. 6 is a schematic block diagram illustrating an embodiment of the device of FIG. 5 after deposition of source/drain embedded stressor material in the stress wells adjacent to the source/drain buffers.

In block 104, source/drain stressor material 601 is deposited in the embedded stressor cavities 301 adjacent to, and optionally over, source/drain buffers 501, resulting in the device 600 as shown in FIG. 6. Source/drain stressor material 601 includes a heavily doped material, such as boron-doped SiGe for a PFET (in particular, in-situ doped boron, or ISDB, SiGe) or phosphorous-doped SiC for an NFET. Source/drain stressor material 601 may be deposited as a crystalline material, and may be deposited by epitaxial deposition. The source/drain stressor material 601 may overfill the embedded stressor cavities 301, as is shown in the embodiment of FIG. 6; the overfill may be from about 0 nm to about 30 nm higher than the top of substrate 201 in some embodiments.

Source/drain stressor material 601 abuts the channel portion 502 of substrate 201 only above the source/drain buffers 501; the depth of this area of contact between the source/drain embedded stressor material 601 and the substrate 201 may be from about 5 nm to about 15 nm in the substrate 201 from the bottom of the gate stack structure 202/203 in some embodiments. This relatively short area of contact between the channel 502 and source/drain stressor material 601 reduces leakage current and junction capacitance of the FET 700 during operation, while inducing stress in the channel portion of substrate 201 to improve the mobility of the channel 502.

Figure 7:
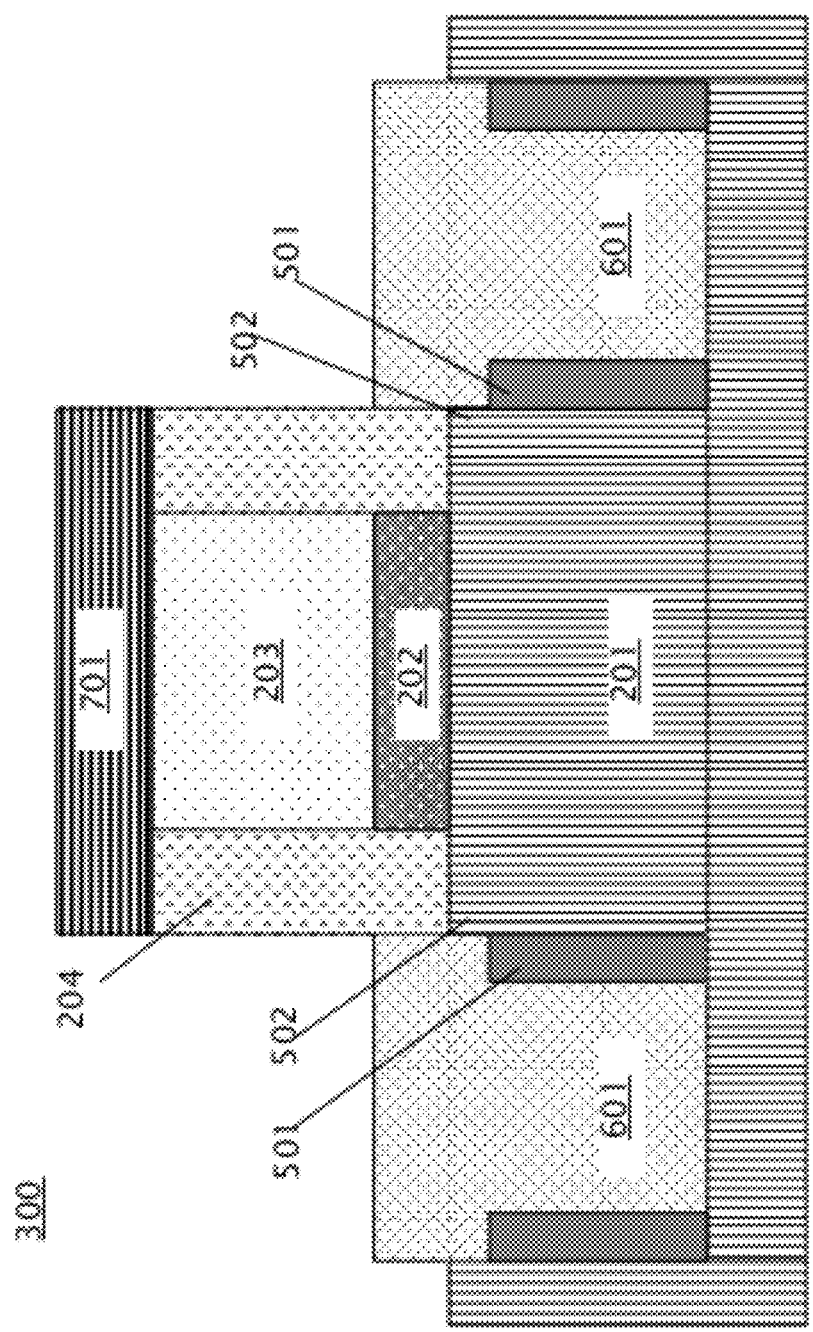
FIG. 7 is a schematic block diagram illustrating an embodiment an embedded stressor FET including source/drain buffers.

Lastly, in block 105, after deposition of source/drain embedded stressor material 601 in block 104, a portion of spacer 204 (and any other material that may have been deposited on top of spacer 204 during blocks 102 or 104) may be removed from the top of gate stack structure 202/203 in embodiments in which the spacer covers the top of the gate. Then a gate contact 701 may be formed on top of gate stack structure 202/203 to form a finished stressed channel FET 700, as shown in FIG. 7. In embodiments in which gate 202/203 includes a dummy gate, the dummy gate may be removed, and a replacement gate formed in place of the dummy gate before formation of the gate contact to form a finished FET.

The technical effects and benefits of exemplary embodiments include a FET with relatively high channel mobility and relatively low leakage current and junction capacitance.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a stressed channel field effect transistor (FET) with source/drain buffers, the method comprising:
    etching cavities in a substrate on either side of a gate stack located on the substrate;
    depositing source/drain buffer material in the cavities;
    etching the source/drain buffer material to form vertical source/drain buffers adjacent to a channel region of the FET, wherein the source/drain buffers are etched such that the channel region of the substrate located underneath the gate stack is exposed on top of the source/drain buffers; and
    depositing source/drain stressor material in the cavities adjacent to and over the vertical source/drain buffers.

2. The method of claim 1, wherein the substrate comprises a silicon-on-insulator (SOI) substrate, and wherein the cavities are located in a top silicon layer of the SOI substrate.

3. The method of claim 1, wherein etching the cavities in the substrate comprises one of anisotropic reactive ion etching and a combination of anisotropic and isotropic reactive ion etching.

4. The method of claim 1, wherein the cavities are etched to a depth from about 30 nanometers to about 80 nanometers in the substrate.

5. The method of claim 1, further comprising doping a portion of the substrate located at the bottom of the cavities after etching the cavities.

6. The method of claim 1, wherein depositing the source/drain buffer material comprises epitaxial deposition.

7. The method of claim 1, wherein the deposited source/drain buffer material has a thickness from about 5 nanometers to about 15 nanometers.

8. The method of claim 1, wherein the source/drain buffer material comprises undoped silicon germanium in the event the FET comprises a p-type FET, and undoped silicon carbide in the event the FET comprises an n-type FET.

9. The method of claim 1, wherein the source/drain buffer material comprises silicon germanium lightly doped with boron in the event the FET comprises a p-type FET, and silicon carbide lightly doped with phosphorous in the event the FET comprises an n-type FET.

10. The method of claim 1, wherein etching the source/drain buffer material to form the source/drain buffers comprises one of anisotropic reactive ion etching and a combination of anisotropic and isotropic etching.

11. The method of claim 1, wherein the exposed channel region of the substrate has a depth from about 5 nanometers to about 15 nanometers in the substrate below the bottom of the gate stack.

12. The method of claim 1, wherein the deposited source/drain stressor material abuts the exposed channel region of the substrate above the source/drain buffers.

13. The method of claim 1, wherein depositing the source/drain stressor material comprises epitaxial deposition.

14. The method of claim 1, wherein the source/drain stressor material comprises highly boron doped silicon germanium in the event the FET comprises a p-type FET, and highly phosphorous doped silicon carbide in the event the FET comprises an n-type FET.

15. The method of claim 14, wherein the source/drain stressor material is doped in situ.

\* \* \* \* \*